United States Patent [19]
Radde et al.

[11] Patent Number: 5,584,717
[45] Date of Patent: Dec. 17, 1996

[54] SLIDE LOCK CARRIER

[75] Inventors: Mechelle L. Radde, Elkhart; Donald E. Ralstin, Lakeville, both of Ind.; Craig J. Reske, Niles, Mich.

[73] Assignee: Wells Electronics, Inc., South Bend, Ind.

[21] Appl. No.: 342,204

[22] Filed: Nov. 18, 1994

[51] Int. Cl.⁶ .............................. H01R 13/62; H05K 1/00
[52] U.S. Cl. ............................................. 439/330; 206/724
[58] Field of Search ....................................... 439/330, 331, 439/526; 206/724, 728, 560, 329; 174/52.1

[56] References Cited

U.S. PATENT DOCUMENTS

| | | | |
|---|---|---|---|
| 4,720,742 | 1/1988 | Egawa et al. | 174/52.1 |
| 4,747,483 | 5/1988 | Grabbe et al. | 206/329 |
| 4,767,984 | 8/1988 | Bakker | 439/331 |
| 5,026,303 | 6/1991 | Matsuoka et al. | 439/526 |
| 5,290,193 | 3/1994 | Goff et al. | 439/331 |
| 5,291,994 | 3/1994 | Murphy | 206/724 |

Primary Examiner—Neil Abrams
Assistant Examiner—Yong Kim
Attorney, Agent, or Firm—Baker & Daniels

[57] ABSTRACT

An IC package mounting device that includes a plurality of independently operative sliding latches or clips to secure the IC package to the device. The sliding latches are housed in guide slots that prevent the latches from becoming disengaged from the carrier assembly, with the guide slots being oriented at an angle relative to the lateral peripheral dimensions of the IC package.

5 Claims, 5 Drawing Sheets

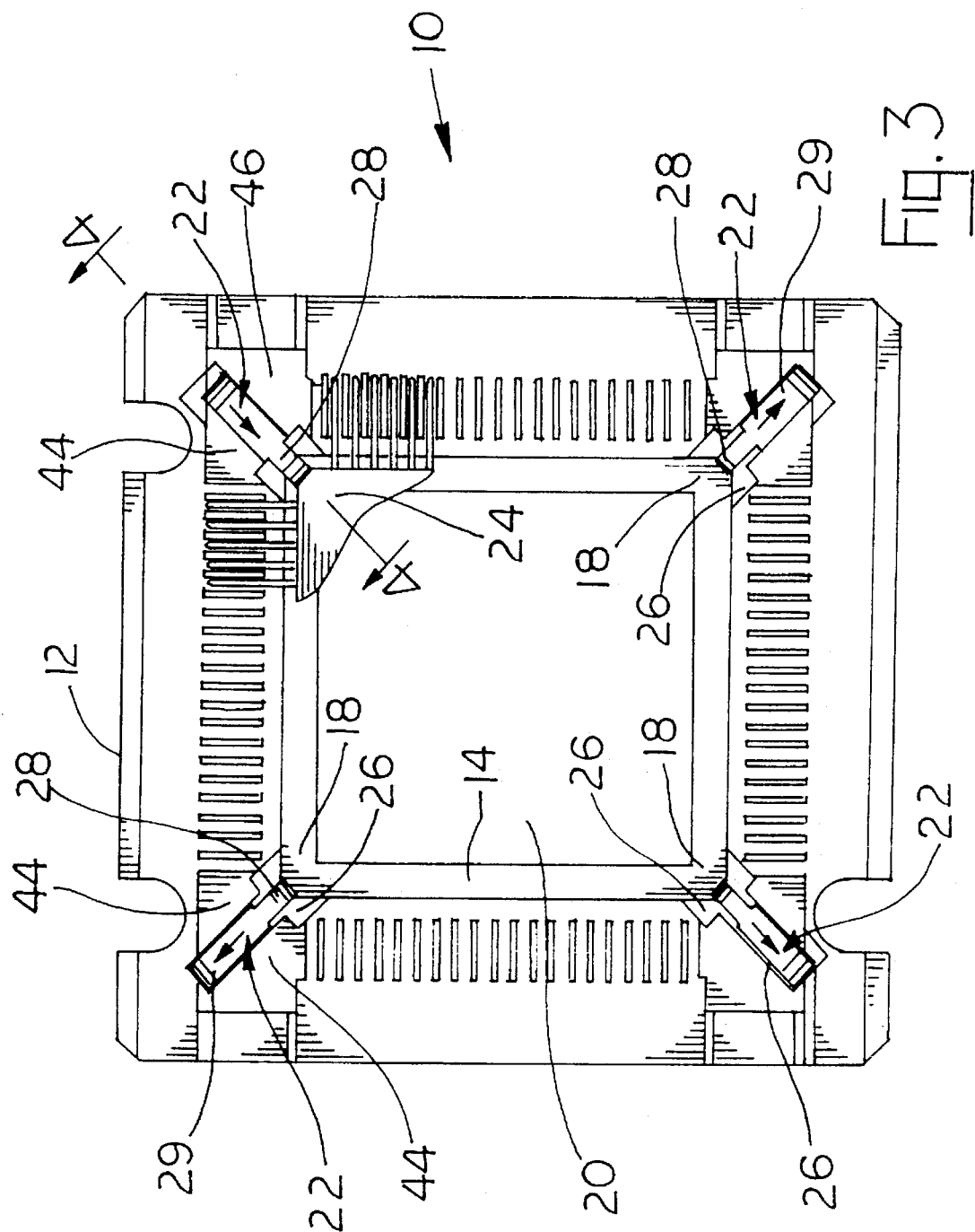

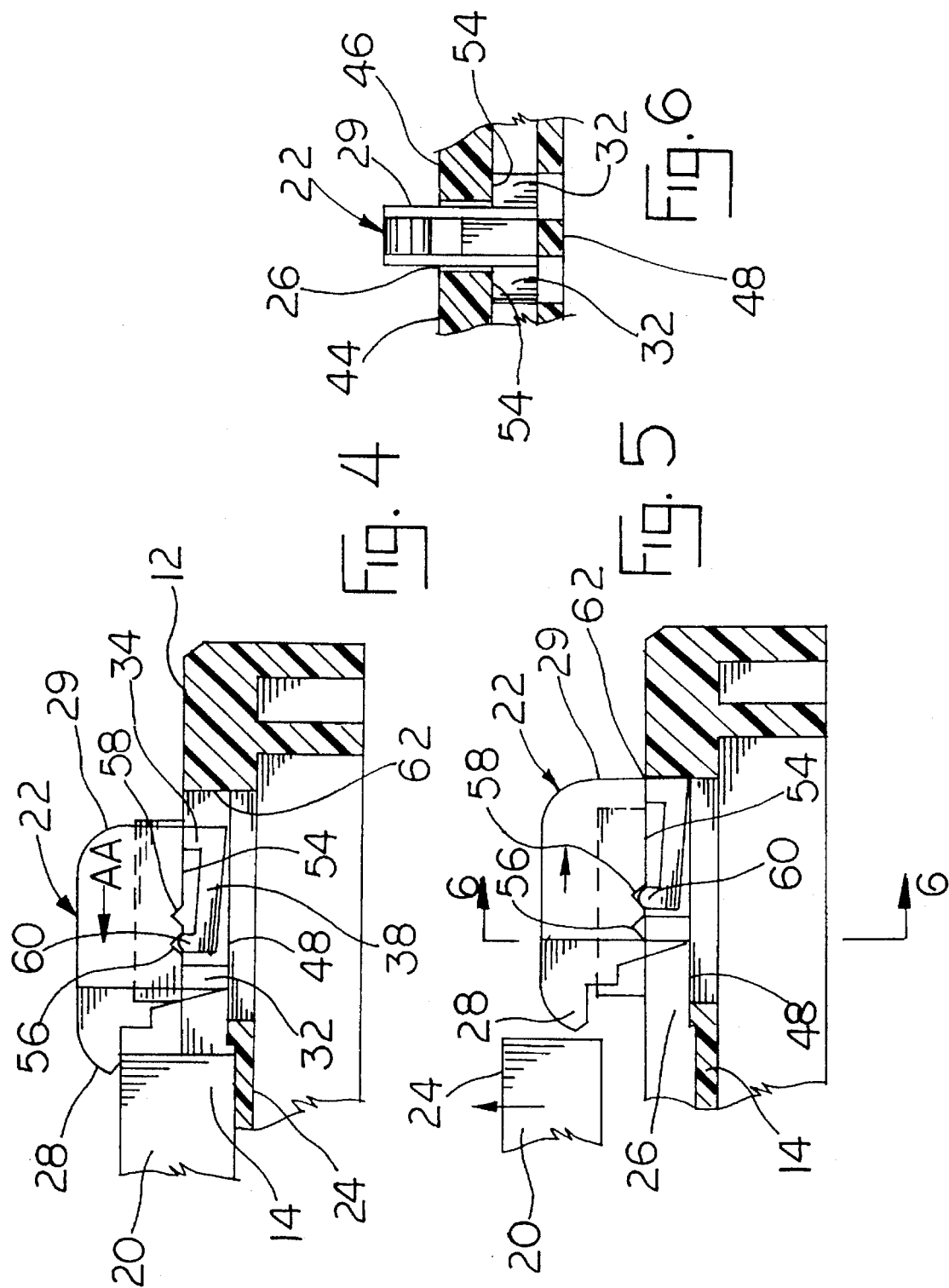

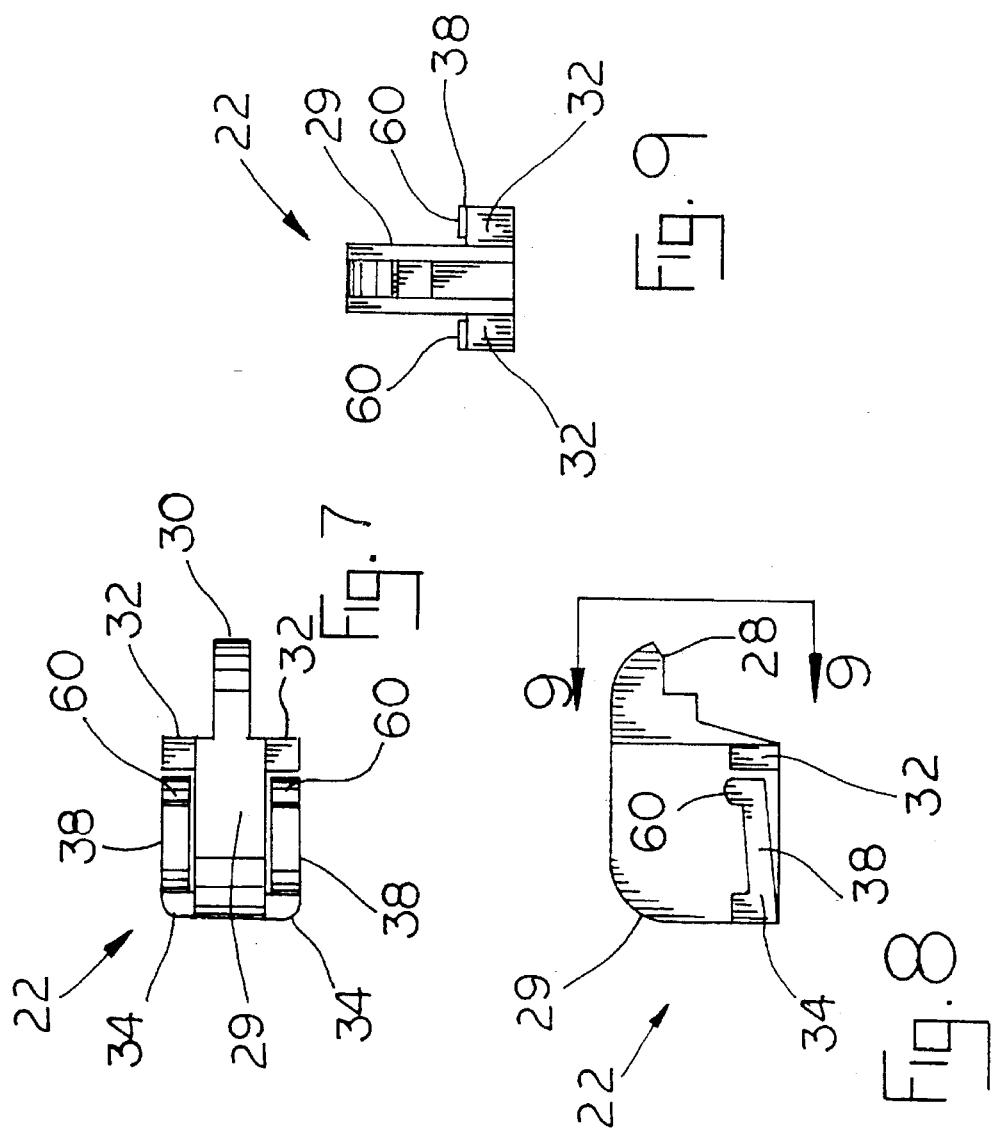

SLIDE LOCK CARRIER

BACKGROUND OF THE INVENTION

The present invention relates generally to a carrier for an IC package. More specifically, the invention disclosed herein describes a slide lock carrier device that utilizes slidable latches located at the corners of the device that secure an IC package within the device for testing and handling, and further offers reliability and space saving advantages compared to previous devices.

Carriers for IC packages are generally well known in the art, although their modes of operation differ greatly. For example, U.S. Pat. No. 5,249,972 discloses a pair of spring loaded pressure members that retain an IC package within the carrier, while the carrier in U.S. Pat. No. 5,290,193 utilizes a hinged cover that rotates over the IC package and secures it in place. Other prior art devices such as U.S. Pat. Nos. 3,963,315 or 4,222,090 employ separate sliding clips to clamp the IC package to the carrier body. The carrier disclosed in U.S. Pat. No. 5,292,266 secures the IC package with clips attached to torsion bars. Still other devices use a variety of sliding or hinged clamps.

IC carriers should be both durable and easy to operate. However, problems with some of the prior art devices include clips that are subject to breakage after repeated use, or clips that are easily pulled off of the device during loading of the IC package. Many of the retaining methods are overly complicated, involving spring loaded hinged covers, while still others simply require too much space and are more difficult to manipulate when the IC package is being inserted into the carrier.

SUMMARY OF THE INVENTION

The present invention functions without the drawbacks inherent in the prior art devices, and utilizes a plurality of linearly retracting sliding latches or clips to secure the IC within the carrier. The main body of the device defines a central recess for placement of the IC package, which is secured to the base by the retaining latches located at the corners of the main body. Each retaining latch has a finger that overlaps an adjacent corner of the IC package, with each latch being housed in a guide slot integrated into the main body of the carrier. The latches slide toward and away from the IC package in order to retain or release the IC package, respectively.

Accordingly, it is an object of this invention to provide for an IC carrier device that is reusable and minimizes breakage or disengagement of the retaining latches.

It is another object of this invention to provide for an improved retaining latch design that saves space and allows easier manipulation of the device during loading.

It is still another object of this invention to provide a carrier device that minimizes the chance that an IC package will be dislodged during testing and handling.

Other objects of the invention will become readily apparent to those skilled in the art upon a reading of the following description.

BRIEF DESCRIPTION OF THE DRAWINGS

A preferred embodiment of the invention has been depicted for purposes of illustration wherein:

FIG. 3 is a top plan view of the device as shown in FIG. 2;

FIG. 4 is fragmentary sectional view taken along line 4—4 in FIG. 3;

FIG. 5 is fragmentary sectional view like FIG. 4 but showing the latch of the device in its release position and the IC carrier being lifted from the device;

FIG. 6 is fragmentary sectional view taken along line 6—6 in FIG. 5;

FIG. 7 is a top plan view of the latch made according to the present invention;

FIG. 8 is a side elevational view of the latch shown in FIG. 7.

FIG. 9 is a front elevational view of the latch shown in FIGS. 7 and 8 seen along line 9—9 in FIG. 8.

DESCRIPTION OF THE PREFERRED EMBODIMENT

Figure 1:
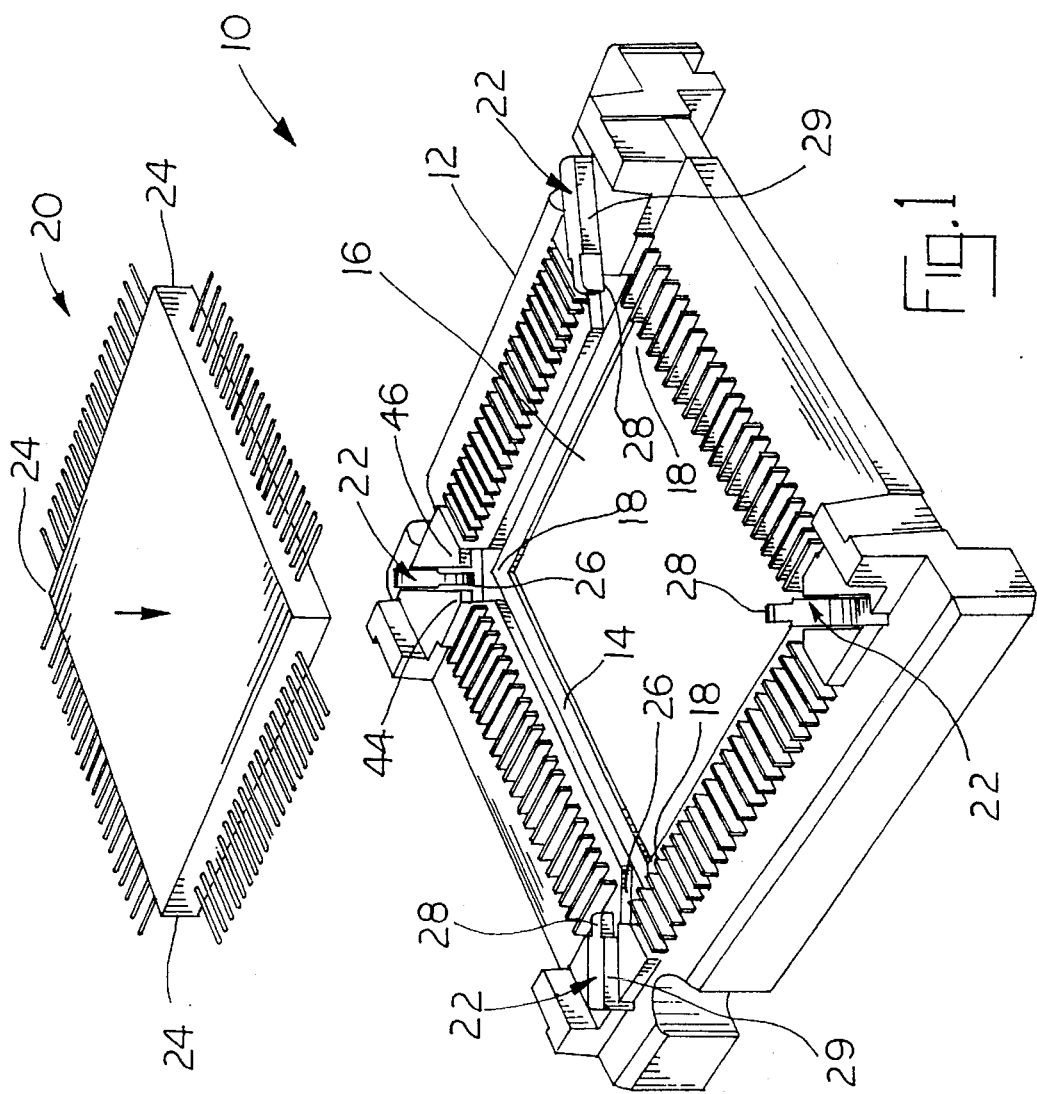
FIG. 1 is a perspective view of a IC carrier device showing an IC package ready for insertion into the carrier device.
Figure 2:
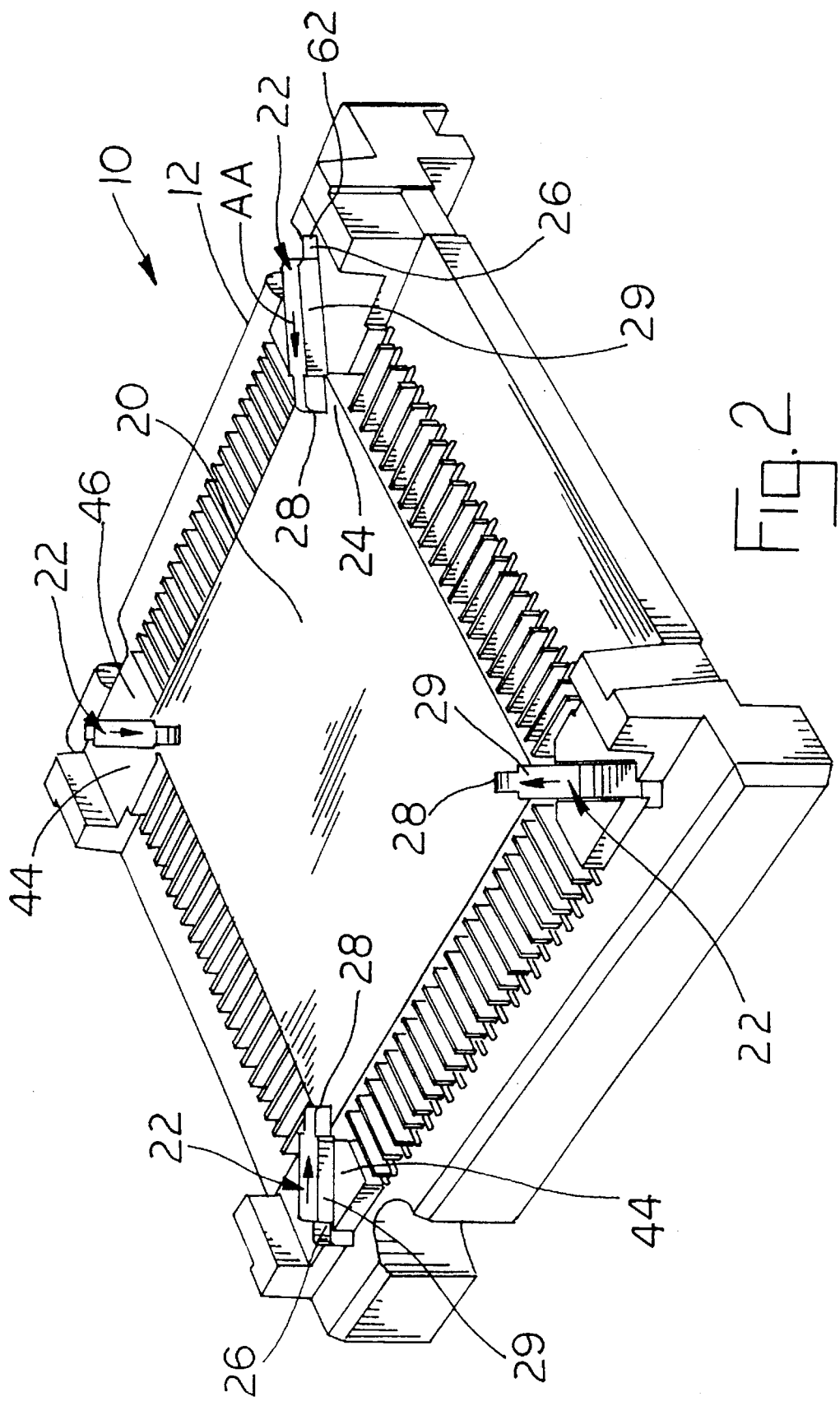
FIG. 2 is a perspective view of the device shown in FIG. 1 showing the IC package disposed and secured within the device.

The preferred embodiment herein described is not intended to be exhaustive or to limit the invention to the precise form disclosed. It is chosen and described to explain the principles of the invention as well as its practical use and application in order to best enable others skilled in the art to follow its teachings.

Referring now to the drawings, a device assembled according to the present invention is generally indicated by the reference numeral 10, and includes a base portion 12. Base member 12 includes a central recess 16 located therein having multiple corners 18. Recess 16 is shown to be square and sized to receive an IC package 20 having complemental multiple corners 24. A plurality of slidable latches 22 are located at the corners of base member 12 and are each positioned to overlie an adjacent corner 24 of IC package 20 when the package is placed in recess 16 and supported upon shoulder 14 of the base.

Each corner 24 has an open slot 26 serving as a guide passage for a latch 22, defined by guide flanges 44 and 46, end wall 62, and slotted floor 48, which is shown in FIG. 6 as a rib for ease of manufacture. As shown in FIGS. 4 and 5, bottom surface 54 of each guide flange 44, 46 contains an inward lock notch 56 and an outward release notch 58.

Each latch 22 includes a finger portion 28 and a body portion 29. Each latch 22 further includes spaced feet 32, 34 and a cantilevered spring arm 38 at each side which extends from one foot 34 towards the other foot 32. A latch 22 is complementally disposed within each guide slot 26, with its spaced feet 32 and 34 interposed within between slotted floor 48 and bottom surface 54, and with its body portion 29 interposed between guide flanges 44 and 46 of base member 12. Body portion 29 of latch 22 abuts against outer wall 62 when latch 22 is in the release position. Top 60 of each cantilever arm 38 engages lock notch 56 or release notch 58 when the latch 22 is in the lock position or the release position, respectively.

With each latch 22 so disposed in a guide slot 26 in base member 12, the latch slides inwardly relative to the base member in a direction generally indicated by reference arrow AA towards recess 16 to a lock position (FIG. 4) where finger portion 28 overlies an adjacent corner 24 of IC package 20 and outwardly relative to the base member away from recess 16 to a release position (FIG. 5).

To operate carrier device 10, each latch 22 is pushed outward to its release position, thereby allowing IC package 20 to be inserted into recess 16 without interference from finger portion 28 of the latch, so that IC package 20 rests on shoulder 14 of base 12. When each latch 22 is urged into its release position, the top 60 of cantilever arm 38 engages release notch 58, and body portion 29 is located next to outer wall 62 of guide slot 26, thereby preventing latch 22 from becoming disengaged from base member 12. After IC package 20 is placed on shoulder 14 of base 12, each latch 22 is pushed inward towards a corner 24 of IC package 20 so that finger portion 28 of each latch 22 overlies the adjacent corner 24 of IC package 20 to secure the IC package to base member 12 of device 10. When latch 22 is urged inward towards IC package 20, top 60 of cantilever arm 38 engages lock notch 56, thereby locking finger portion 28 of latch 22 in securing engagement with corner 24 of IC package 20.

It is understood that the above description does not limit the invention to the above-given details, but that the invention may be modified within the scope of the following claims.

We claim:

1. A device for carrying an IC package having multiple corners, said device comprising a base member including a central recess with multiple corners for complementarily receiving said IC package therein, at least two latch members carried by said base member and located at oppositely positioned said corners of said recess for retaining said IC package within said base member, each latch member being adapted in a lock position to overlie a portion of said IC package when the package is received in said central recess and further being slidable from said lock position to a release position spaced laterally from said IC package, said base member including a guide means at each of said oppositely positioned base member corners for slidably housing a said latch member for reciprocating movement toward and away from said IC package, said guide means being disposed at an angle relative to the lateral peripheral dimensions of said IC package, each said latch member including a finger portion for overlying and engaging said portion of a said IC package corner, each said guide means for allowing said reciprocating movement of its said housed latch member independently of the other said latch members, each said latch member including biasing means engaging said base member for urging the latch member against said base member.

2. A device for carrying an IC package as claimed in claim 1, wherein each said guide means includes a slot in said base member defined at least in part by parallel opposed in-turned flanges, a said housed latch member fitted within said slot between said flanges for allowing said reciprocating movement along said slot.

3. A device for carrying an IC package as claimed in claim 1, and stop means carried by said biasing means for positioning said latch member thereof in said lock and release positions.

4. A device for carrying an IC package as claimed in claim 1, wherein each said latch member further includes a body portion having said biasing means, said biasing means including a cantilevered arm in flexed contact with a said in-turned flange.

5. A device for carrying an IC package as claimed in claim 4, wherein said arm of each latch member includes at least one engagement part, and said in-turned flange contacted by said arm includes a corresponding engagement part means for interlocking with said arm engagement part to position the latch member in one of said lock or release positions.

* * * * *